United States Patent
Naito et al.

(10) Patent No.: US 9,847,150 B2
(45) Date of Patent: Dec. 19, 2017

(54) METHOD OF MANUFACTURING TRANSPARENT CONDUCTOR, TRANSPARENT CONDUCTOR AND DEVICE FOR MANUFACTURING THE SAME, AND DEVICE FOR MANUFACTURING TRANSPARENT CONDUCTOR PRECURSOR

(71) Applicant: KABUSHIKI KAISHA TOSHIBA, Minato-ku, Tokyo (JP)

(72) Inventors: Katsuyuki Naito, Tokyo (JP); Yoshihiro Akasaka, Kanagawa (JP); Tianyi Yang, Kanagawa (JP); Norihiro Yoshinaga, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 185 days.

(21) Appl. No.: 14/657,571

(22) Filed: Mar. 13, 2015

(65) Prior Publication Data
US 2015/0262724 A1 Sep. 17, 2015

(30) Foreign Application Priority Data
Mar. 14, 2014 (JP) .................................. 2014-051797

(51) Int. Cl.
*H01B 1/02* (2006.01)
*H01B 1/24* (2006.01)
(Continued)

(52) U.S. Cl.
CPC ................ *H01B 1/02* (2013.01); *B82Y 10/00* (2013.01); *B82Y 30/00* (2013.01); *B82Y 40/00* (2013.01);
(Continued)

(58) Field of Classification Search
None
See application file for complete search history.

(56) References Cited

U.S. PATENT DOCUMENTS

2011/0195207 A1  8/2011  Hong et al.
2011/0217451 A1  9/2011  Veerasamy
(Continued)

FOREIGN PATENT DOCUMENTS

JP    2009-127092    6/2009
JP    2011-162977 A  8/2011
(Continued)

OTHER PUBLICATIONS

Extended European Search Report issued by the European Patent Office dated Jul. 30, 2015, in counterpart European Application No. 15158603.9-1552.
(Continued)

*Primary Examiner* — Jiong-Ping Lu
(74) *Attorney, Agent, or Firm* — Finnegan, Henderson, Farabow, Garrett & Dunner, L.L.P.

(57) ABSTRACT

According to one embodiment, a method of manufacturing a transparent conductor is provided. In the method, a silver nanowire layer including a plurality of silver nanowires and having openings is formed on a graphene film supported by a copper support. Then, a transparent resin layer insoluble in a copper-etching solution is formed on the silver nanowire layer such that the transparent resin layer contacts the graphene film through the openings. The copper support is then brought into contact with the non-acidic copper-etching solution to remove the copper support, thereby exposing the graphene film.

9 Claims, 6 Drawing Sheets

(51) Int. Cl.

| | |
|---|---|
| *B82Y 30/00* | (2011.01) |
| *H01B 1/22* | (2006.01) |
| *H01B 1/20* | (2006.01) |
| *C23F 1/18* | (2006.01) |
| *B82Y 10/00* | (2011.01) |
| *B82Y 40/00* | (2011.01) |
| *G06F 3/041* | (2006.01) |
| *H01B 1/04* | (2006.01) |
| *H01L 51/44* | (2006.01) |
| *H01L 31/0224* | (2006.01) |
| *H01L 51/52* | (2006.01) |
| *H01L 29/16* | (2006.01) |
| *H01L 29/41* | (2006.01) |
| *C23F 1/00* | (2006.01) |
| *C23F 1/08* | (2006.01) |
| *H01L 51/00* | (2006.01) |
| *H01L 31/028* | (2006.01) |

(52) U.S. Cl.
CPC .................. *C23F 1/00* (2013.01); *C23F 1/08* (2013.01); *C23F 1/18* (2013.01); *G06F 3/041* (2013.01); *H01B 1/04* (2013.01); *H01B 1/20* (2013.01); *H01B 1/22* (2013.01); *H01B 1/24* (2013.01); *H01L 29/1606* (2013.01); *H01L 29/413* (2013.01); *H01L 31/028* (2013.01); *H01L 31/022466* (2013.01); *H01L 51/003* (2013.01); *H01L 51/0021* (2013.01); *H01L 51/442* (2013.01); *H01L 51/5215* (2013.01); *H01L 51/5234* (2013.01); *G06F 2203/04103* (2013.01); *Y02E 10/549* (2013.01); *Y02P 70/521* (2015.11); *Y10T 428/24331* (2015.01)

(56) References Cited

U.S. PATENT DOCUMENTS

| | | | |
|---|---|---|---|
| 2013/0078449 A1 | 3/2013 | Naito et al. | |
| 2013/0081678 A1* | 4/2013 | Naito | H01B 1/02 |
| | | | 136/252 |
| 2013/0099196 A1* | 4/2013 | Wu | H01L 21/02376 |
| | | | 257/9 |
| 2013/0130037 A1 | 5/2013 | Bol et al. | |
| 2013/0255764 A1 | 10/2013 | Naito et al. | |
| 2013/0341571 A1 | 12/2013 | Iijima et al. | |
| 2014/0008637 A1 | 1/2014 | Tanaka et al. | |
| 2014/0014171 A1 | 11/2014 | Alam et al. | |
| 2015/0194549 A1* | 7/2015 | Weman | H01L 31/02246 |
| | | | 136/244 |

FOREIGN PATENT DOCUMENTS

| | | |
|---|---|---|
| JP | 2012-190659 | 10/2012 |
| JP | 2012-207223 | 10/2012 |
| JP | 2012-214689 | 11/2012 |
| JP | 2013-051335 | 3/2013 |
| JP | 2013-073746 A | 4/2013 |
| JP | 2013-80565 | 5/2013 |
| JP | 2013-211212 | 10/2013 |
| JP | 2013-541798 A | 11/2013 |
| WO | WO 2011/112589 A1 | 9/2011 |

OTHER PUBLICATIONS

Mi-Sun Lee, et al., "High Performance, Transparent, and Stretchable Electrodes Using Graphene-Metal Nanoware Hybrid Structures", Nano Letters, 2013, vol. 13, pp. 2814-2821.

* cited by examiner

METHOD OF MANUFACTURING TRANSPARENT CONDUCTOR, TRANSPARENT CONDUCTOR AND DEVICE FOR MANUFACTURING THE SAME, AND DEVICE FOR MANUFACTURING TRANSPARENT CONDUCTOR PRECURSOR

CROSS-REFERENCE TO RELATED APPLICATION

This application is based upon and claims the benefit of priority from Japanese Patent Application No. 2014-051797, filed Mar. 14, 2014; the entire contents of which are incorporated herein by reference.

FIELD

Embodiments described herein relate generally to methods of manufacturing transparent conductors, transparent conductors and devices for manufacturing the same, and devices for manufacturing transparent conductor precursors.

BACKGROUND

Carbon substances such as carbon fiber, carbon nanotube, and graphene have been known as conductive materials. Metallic nanomaterials such as metallic nanoparticles and metallic nanowires have also been known as conductive materials. Electric devices such as liquid crystal display devices and photoelectric conversion devices (for example, organic EL devices, solar batteries, optical sensors, and the like) have been developed using these conductive materials.

The conductive materials obtained using the carbon substances can significantly reduce the used amount of rare metals or the like. In some cases, these conductive materials even enable no metal to be used at all. The conductive materials obtained using the carbon substances have high flexibility and high mechanical strength. In addition, the conductive materials are chemically stable. Therefore, attention has been paid to them as promising conductive materials.

Although carbon substances have relatively high conductivities, in conductive materials obtained using the carbon substances, the electrical resistance in conduction between molecules is high. In the case where a conductive material obtained using the carbon substance is used as a transparent electrode with a large area, the electrical resistance becomes higher in comparison to that in an indium tin oxide (ITO) film having the same light transmission. In the case where a conductive material obtained using the carbon substance is used as a wire or the like with a long total length, the electric resistance is higher compared with a metal conductive material such as copper (Cu). By combining metallic nanomaterials having high conductivities with the carbon substance, the conductivity can be improved.

An ITO film is generally used as the transparent electrode in electric devices such as liquid crystal displays, solar cells, and organic EL devices. Aluminum (Al) which has a small work function, a magnesium (Mg) alloy which has a smaller work function, or the like is used as the negative electrode of photoelectric conversion devices. Although its efficiency is low, a photoelectric conversion device is also known, which uses an ITO film as a negative electrode and a metal having a large work function as a positive electrode.

Indium (In), which is a rare metal, is used for ITO films. Carbon nanotubes and thin films of planar graphene have been explored as inexpensive, stable, and flexible transparent electrodes obtained without using Indium (In).

DETAILED DESCRIPTION

A method of manufacturing a transparent conductor according to an embodiment includes forming a silver nanowire layer on a graphene film supported by a copper support, the silver nanowire layer including a plurality of silver nanowires and having an opening;

forming a transparent resin layer on the silver nanowire layer such that the transparent resin layer contacts the graphene film through the opening, the transparent resin layer being insoluble in a copper-etching solution; and removing the copper support by bringing the copper support into contact with a non-acidic copper-etching solution after forming the transparent resin layer, to expose the graphene film.

Hereinafter, the embodiment will be described with reference to the drawings.

The following method for manufacturing a graphene film is known. First, the graphene film is formed on a Cu film as a support, for example, by a chemical vapor deposition (CVD) method. Next, the thus-obtained laminate of the Cu film and graphene film is transferred onto a polymer film. The Cu film is dissolved and removed with an acidic or basic etching solution. There is not known a technique, which uses a similar method, for collectively transferring a transparent conductive film obtained by laminating a graphene film and a silver nanowire layer to a polymer film. The manufacture of a transparent conductive film obtained by stacking together a graphene film and a silver nanowire layer requires two transfers, that is, transfer of a graphene film onto a polymethyl methacrylate (PMMA) film or a thermal transfer film and transfer of a graphene film onto a silver nanowire layer. In addition, it is difficult to make the surface of the obtained transparent conductive film flat.

The present inventors found a method that solves such conventional problems, thereby allowing a transparent conductor having a high conductivity, an excellent transparency, and a flat surface to be manufactured easily.

Figure 1A:
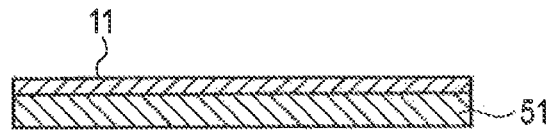
FIGS. 1A to 1D are cross-sectional views showing a method of manufacturing a transparent conductor according to one embodiment.
Figure 1B:
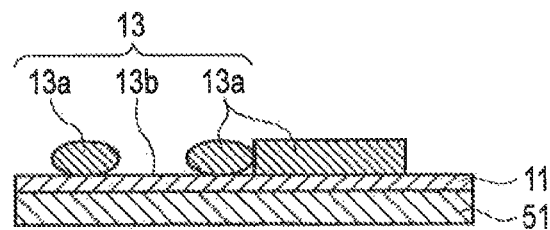
Figure 1C:
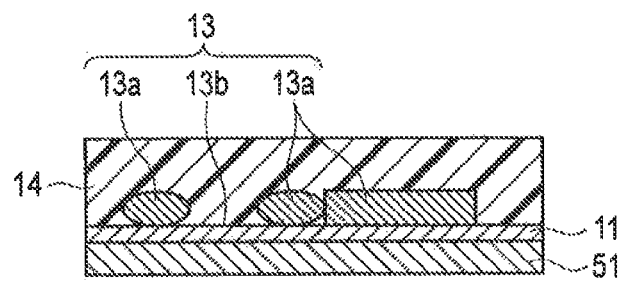

In a method according to one embodiment, a graphene film 11 supported by a copper support 51, as shown in FIG. 1A, is used. As shown in FIG. 1B, a silver nanowire layer 13 including a plurality of silver nanowires 13*a* is formed on the graphene film 11. Furthermore, as shown in FIG. 1C, a transparent resin layer 14, a part of which contacts a surface of the graphene film 11, is disposed on the silver nanowire layer 13. In consideration of the subsequent copper etching, the transparent resin layer 14 is formed of a material that is insoluble in a copper-etching solution.

Figure 1D:
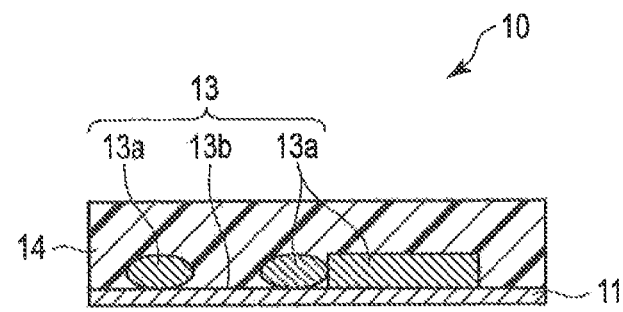

The copper support 51 is removed by a non-acidic copper-etching solution to expose the surface of the graphene film 11 that had been in contact with the copper support 51. Thus, a transparent conductor 10 as shown in FIG. 1D is obtained. The transparent conductor 10 according to the embodiment comprises the graphene film 11, the silver nanowire layer 13 on the graphene film 11, the silver nanowire layer 13 including a plurality of silver nanowires 13a and having an opening 13b, and the transparent resin layer 14 on the silver nanowire layer 13, the transparent resin layer 14 being in contact with the graphene film 11 through the opening 13b of the silver nanowire layer 13. Specifics of the method of manufacturing the transparent conductor according to the embodiment, such as the materials to be used, or the like, will be described in detail later.

The copper support 51 is preferably a copper foil. Copper foil can be easily enlarged by a rolling process. When copper foil is used, the graphene film 11 can be formed on the copper foil without separately using a support. When the thickness of the copper foil is too large, the later etching to remove the copper foil requires a long time. In contrast, when the thickness of the copper foil is too small, handling of the copper foil becomes difficult. For example, when the thickness of the copper foil is too small, the copper foil is not suitable for a roll-to-roll process. The thickness of the copper foil used as the copper support 51 is preferably 1 to 50 μm, more preferably 10 to 20 μm, and still more preferably about 12 μm.

The graphene film 11 formed on the copper support 51 is preferably manufactured by a thermal CVD method. The thermal CVD method can form graphene of high density. The graphene manufactured by the thermal CVD method has a high conductivity as well. Further, the graphene film 11 obtained by the thermal CVD method functions as a highly protective film towards the silver nanowires 13a as well.

As shown in FIG. 1B, the silver nanowire layer 13 includes a plurality of silver nanowires 13a and openings 13b. The silver nanowire layer 13 can be formed by applying a dispersion solution of the silver nanowires 13a on the graphene film 11 by a coating method such as a spin coat method, a spray coat method, or an applicator coat method.

The manufactured silver nanowire layer 13 may be heated at a temperature of 100° C. or more, or may be pressed by a pressing machine or the like. In this case, the silver nanowires 13a fuse together to further improve the conductivity. When the silver nanowire layer 13 includes nanowires having different diameters, a surface resistance, a total optical transmittance, an optical reflectance, a Haze value, or the like can be changed.

The transparent resin layer 14 is disposed on the silver nanowire layer 13. As shown in FIG. 1C, the openings 13b of the silver nanowire layer 13 are embedded with transparent resin. In this portion, the transparent resin layer 14 contacts a surface of the graphene film 11. A thermoplastic, thermosetting, or light curing resin can be used as the transparent resin. A flexible device can be obtained by using the thermoplastic resin. A stable and heat resistant transparent conductor can be manufactured without being affected by an organic solvent or the like by using the thermosetting or light curing resin.

After the transparent resin layer 14 is formed, the copper support 51 is selectively removed by etching using a non-acidic copper-etching solution, to expose the graphene film 11. The non-acidic copper-etching solution is used such that the silver nanowires 13a do not dissolve. A basic or weakly basic copper-etching solution can be used as the non-acidic copper-etching solution. The copper-etching solution preferably includes $CuCl_2$ and ammonia or an organic amine, and in some cases includes an organic carboxylic acid.

The copper support 51 may be brought into contact with an acidic copper-etching solution before etching with the non-acidic copper-etching solution. Although the silver nanowires are dissolved in the acidic etching solution, the speed of dissolving of copper in the acidic etching solution is fast. While the silver nanowires 13a are sufficiently protected by the copper support 51, the acidic copper-etching solution can be used without consequence. Thereafter, a non-acidic copper-etching solution, which does not dissolve the silver nanowires 13a, may be used. Thus, the overall etching time can be shortened. Examples of the acidic copper-etching solution include hydrochloric acid solutions or sulfuric acid solutions, which include $FeCl_3$ or $CuCl_2$, nitric acid solutions, and aqueous solutions of ammonium persulfate.

Since the graphene film 11 is formed on the copper support 51, copper is inevitably present in the graphene film 11. However, an amount of copper of 1 atomic % or less based on carbon atoms is tolerable. When the content of copper in the graphene film is 1 atomic % or less, copper migration and the generation of decarbonizing reactions that use copper as a catalyst can be suppressed.

As shown in FIG. 1D, the transparent conductor 10 according to one embodiment includes a graphene film 11 and a silver nanowire layer 13 disposed on the graphene film 11. A surface of the transparent conductor 10 that has the silver nanowire layer 13 is covered with a transparent resin layer 14. The other surface of the transparent conductor 10 is constituted by the graphene film 11. The silver nanowire layer 13 includes a plurality of silver nanowires 13a, and has openings 13b. In the openings 13b, the transparent resin layer 14 contacts the graphene film 11.

The graphene film 11 and the silver nanowires 13a are in contact with each other, and thereby electric charges can be smoothly transferred between the graphene film 11 and the silver nanowires 13a, decreasing contact resistance. The openings 13b in the silver nanowire layer 13 are embedded with the transparent resin. Here, the transparent resin layer 14 and the graphene film 11 are in contact with each other. This reduces light scattering and provides the graphene film 11 having a substantially flat surface.

Figure 2:
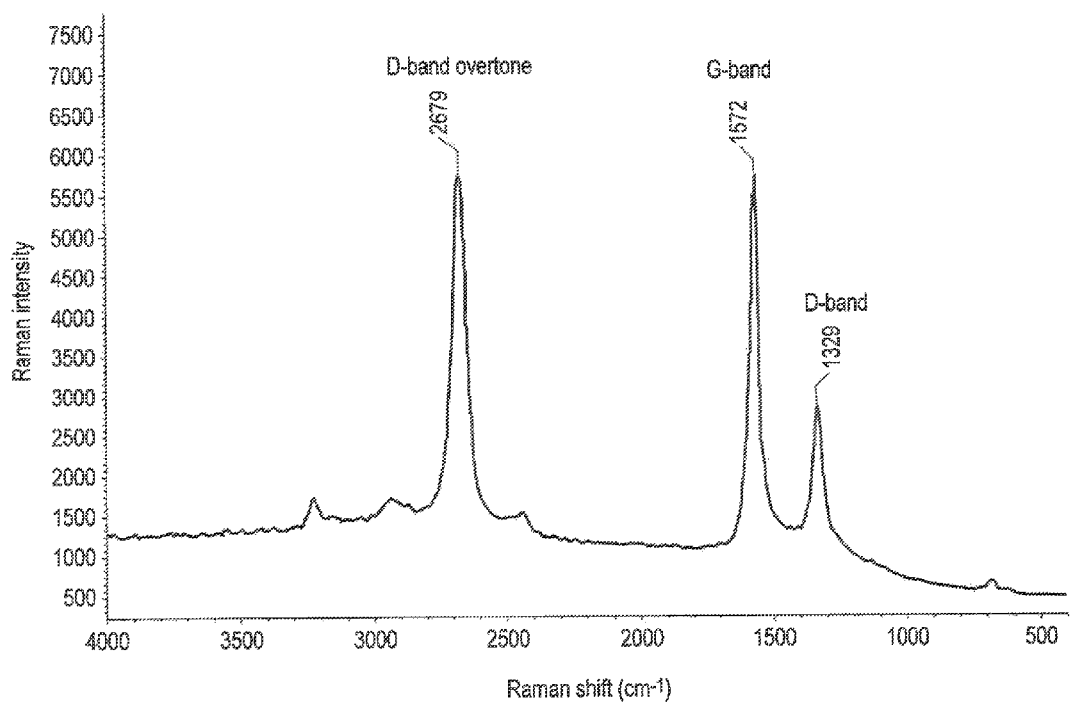
FIG. 2 is a schematic view showing a Raman spectrum of a graphene film according to one embodiment.

In one embodiment, a peak height of the G band in a Raman spectrum of the graphene film 11 is larger than that of the D band. This is a property of graphene films formed by a thermal CVD method. A ratio of the peak height of the G band to that of the D band (G/D) in graphene having carbon atoms partially substituted with nitrogen atoms tends to be smaller than that in unsubstituted graphene. However, even in nitrogen-substituted graphene, the ratio of the peak height of the G band to that of the D band (G/D) may be 2 or more as shown in FIG. 2.

Figure 3:
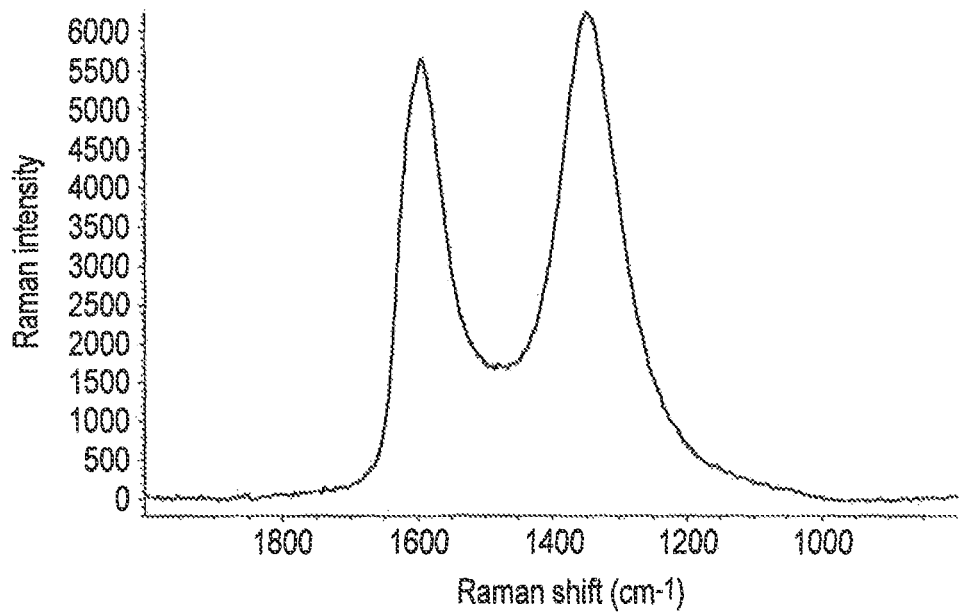
FIG. 3 is a schematic view showing a Raman spectrum of a conventional graphene film.

Other than the thermal CVD method, an application method or the like is also known as a method of manufacturing the graphene film. In the case of a graphene film 11 manufactured by a method other than the CVD method, the peak height of the G band in a Raman spectrum is smaller than that of the D band, as shown in FIG. 3.

As described above, by having on one surface a particular graphene film having high conductivity and having the transparent resin layer 14 contact the silver nanowires 13a and the graphene film 11, a transparent conductor 10 having high conductivity, transparency, and a sufficiently flat surface is obtained.

Figure 4:
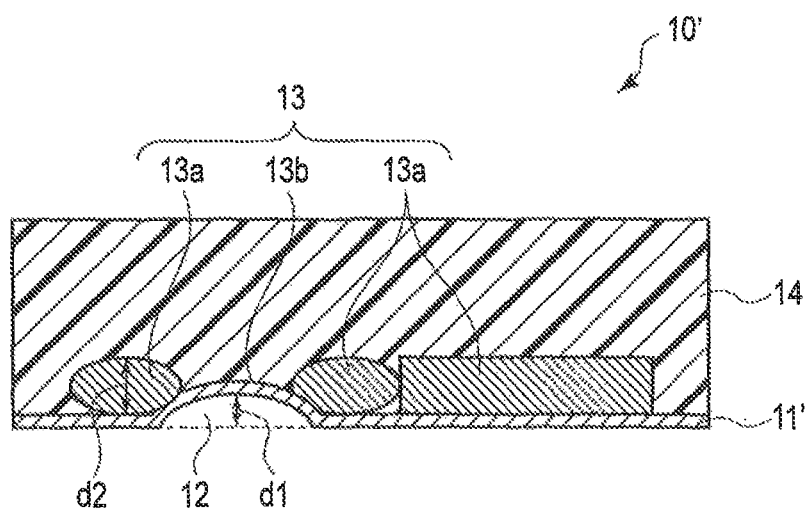
FIG. 4 is a schematic view showing another transparent conductor according to another embodiment.

Recesses formed on the surface of the graphene film 11 are tolerated, as long as the recesses have size equal to or less than half of the diameter of the silver nanowires 13*a*. With reference to FIG. 4, the constitution of a transparent conductor according to another embodiment will be described. In a transparent conductor 10' that is shown, a graphene film 11' has a recess 12 on the surface. A part of the graphene film 11' that contacts the transparent resin layer 14 protrudes into the transparent resin layer 14, thereby producing the recess 12. The recess 12 corresponds to an opening 13*b* of a silver nanowire layer 13. A depth (a maximum distance from a flat face of the graphene film 11') d1 of the recess 12 is preferably equal to or less than half of a diameter d2 of the silver nanowires 13*a*. When the depth of the recess 12 is within this extent, the distortion of the graphene film 11' can be reduced, which can avoid an increase in an electric resistance. This can also prevent the transparent conductor 10' from being easily broken. The depth d1 and the diameter d2 can be directly measured by using vapor deposition to deposit a metal such as Pd on the surface, thereafter filling the recess 12 with an epoxy resin or the like, and then observing cross-sectional TEM (Transmission Electron Microscope) images and cross-sectional SEM (Scanning Electron Microscope) images. There may be distribution in the values of diameter d2. In that case, the maximum value in the diameters d2 of the silver nanowires that contact the recess 12 is used.

Figure 5:
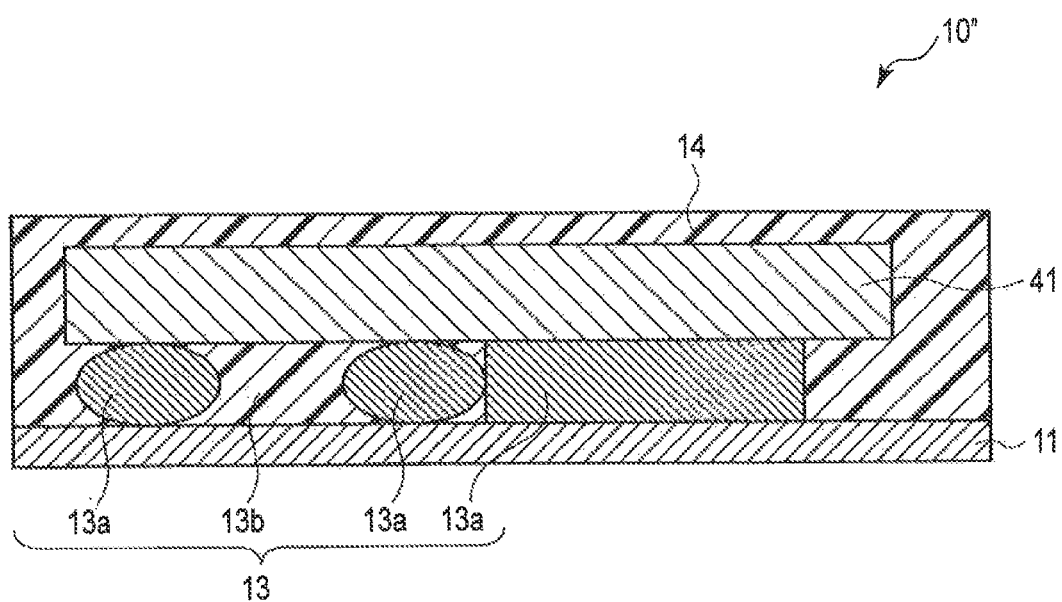
FIG. 5 is a schematic view showing another transparent conductor according to another embodiment.

The transparent conductor according to an embodiment can be applied to a solar battery or a lighting device, for example. In solar batteries and lighting devices having large areas, the energy conversion efficiency decreases when the electrical resistance of the transparent electrode is high. Therefore, solar batteries and lighting devices may require metal wiring having low resistance. As shown in a cross-sectional view in FIG. 5, a transparent conductor 10" having an electrode with reduced electric resistance is obtained by forming a metal wiring 41 on the silver nanowire layer 13. The metal wiring 41 can be formed of a metal selected from the group consisting of Au, Cu, Ag, Ti, W, and Al, for example. The metal wiring 41 is preferably formed using an Ag paste which can be pattern-printed, a metallic foil which can be attached by pressure-bonding, or the like.

In one embodiment, the graphene film 11 can be formed on the copper support 51 by the following technique, for example.

First, single-layered graphene is obtained on a Cu foil as the copper support 51 by a chemical vapor deposition (CVD) method. However, two or more layers of graphene may be formed in some areas. In the CVD method, methane, hydrogen, and argon can be mixed and be used as a gas mixture including raw materials. Ethylene, acetylene, methanol, and ethanol or the like may be used in place of methane. Thereafter, cooling under an argon flow yields the single-layered graphene formed on the Cu foil. It is preferable that the surface of the Cu foil is previously annealed by a heat treatment with laser irradiation to increase the crystal grain size.

The graphene film 11 can also be formed on the copper support 51 using plasma. For example, the plasma can be produced by irradiation of microwaves in a mixed atmosphere including methane, hydrogen, and argon.

Multi-layered graphene is obtained by stacking a plurality of layers of single-layered graphene. As the number of stacked layers of graphene increases, the conductivity increases. However, the optical transparency decreases. When the transparent conductor according to the embodiment is used as a transparent electrode, the layer number of the multi-layered graphene is preferably 8 layers or less, and more preferably 4 layers or less. The number of layers of the graphene can be measured by a cross-sectional observation using a transmission electron microscope (TEM) with high resolution.

A part of the carbon atoms in the graphene may be substituted with nitrogen atoms or boron atoms.

When the graphene in the graphene film 11 is partially substituted with the nitrogen atoms, the work function of the graphene film 11 is 4.2 eV or less. Such materials having small work functions can be suitably used as negative electrodes of photoelectric conversion devices. As for materials used as positive electrodes, the materials are required to have work functions of 4.6 eV or more. Inexpensive ITO and poly(3,4-ethylenedioxythiophene) (PEDOT) or the like have a high work function, and are appropriately used as the positive electrode.

The graphene in which a part of the carbon atoms are substituted with nitrogen atoms (nitrogen-substituted graphene) can be manufactured by a CVD method as follows. Examples include a technique of mixing ammonia with methane as a raw material or using a low-molecular nitrogen compound including carbon atoms and nitrogen atoms (for example, pyridine, methylamine, ethylene diamine, and urea or the like) as a raw material. Alternatively, graphene oxide may be treated and heated with hydrazine. Further, the graphene may be treated at high temperature in an ammonia flow. Even further, nitrogen-substituted graphene can also be obtained by treating a nitrogen-containing polymer at high temperature, although the G/D ratio is decreased.

The nitrogen atoms are classified into quaternary nitrogen, pyridinic nitrogen, pyrrolic/pyrolidonic nitrogen, and nitrogen bonded to oxygen. The nitrogen atoms substituting a part of carbon atoms of the graphene are coordinative toward metallic substances, and further strengthen the bonding of the graphene to the metallic substances. Additionally, the presence of the nitrogen atoms causes electron transfer to become easy, and thereby the electrical resistance of the interface between the graphene and the metallic substances is reduced. The presence of the nitrogen atoms can also protect metallic substances that are easily oxidized or sulfurated.

In the X-ray photoelectron spectrum (X-ray Photoelectron Spectroscopy: XPS) of the 1s electron of the nitrogen atoms, the intensity at 401.2 eV is preferably larger than the intensity at 398.5 eV. The nitrogen atom corresponding to the intensity at 401.2 eV is a quaternary nitrogen atom. The quaternary nitrogen atom supplies an electron to the graphene framework. Since the presence of the quaternary nitrogen atom increases the number of carriers, the work function is decreased, and the conductivity is increased.

In contrast, the nitrogen atom corresponding to the intensity at 398.5 eV is a pyridinic nitrogen atom. The pyridinic nitrogen atom has properties as an acceptor and therefore inhibits the effects of the quaternary nitrogen atom, and further acts an electron trap. However, the pyridinic nitrogen has good bonding properties to a metal and is effective in lowering contact barriers. Accordingly, the ratio of the intensity at 398.5 eV to the intensity ($I_{401.2}$) at 401.2 eV ($I_{398.5}/I_{401.2}$) is preferably 1/1.1 to 1/10.

When the amount of the nitrogen atoms with respect to the amount of the carbon atoms in the graphene is too small, the desired effect is not sufficiently obtained. In contrast, when the amount of the nitrogen atoms is too large, the structure of the graphene framework becomes disordered, which may result in a decrease in electric conductivity. When the ratio of the nitrogen atoms to the carbon atoms (N/C) is within the range of 1/5 to 1/1000, a desired effect is obtained without incurring such disadvantages. More preferably, the amount of the nitrogen atoms with respect to the amount of the carbon atoms is 1/10 to 1/200.

Furthermore, in the XPS spectrum, the ratio of the O1s peak intensity ($I_{530}$) near 530 eV of oxygen atoms to the C1s peak intensity ($I_{285}$) near 285 eV of carbon atoms ($I_{530}/I_{285}$) is preferably 1/10 or less. When the peak intensity ratio is larger than 1/10, electrons are trapped due to the properties of the oxygen atoms as acceptors, which results in a decrease in a conductivity. More preferably, the peak intensity ratio is 1/50 to 1/300. When the peak intensity ratio is too small, the stability against external oxygen may be decreased.

When measured from a finished product, the measurement by XPS can be achieved by exposing the surface of a target conductive layer. Since the graphene is stable to various solvents (e.g., methanol), impurities adsorbed on the surface are removed by cleaning with a solvent. When oxygen molecules and water molecules are adsorbed, the peak intensity of oxygen atoms is different. Therefore, a sample is desirably left in vacuum at 200° C. for one day or more, before the XPS measurement.

The ratio between carbon atoms and oxygen atoms, and the ratio between carbon atoms and nitrogen atoms can be measured by XPS. The signal sensitivity varies depending on the device. The signal strength of each element may be adjusted by using a material with known composition as a reference substance. For example, carbon nitride, having the composition of $C_3N_4$, can be used as a standard substance of C/N.

When the carbon atoms in the graphene are partially substituted with boron atoms (boron-substituted graphene), the following effect is obtained. For example, the carbon atoms are partially substituted with trivalent boron atoms, thereby increasing the work function and the conductivity. The transparent conductor including such a graphene is preferably used as the positive electrode.

The boron-substituted graphene can be obtained by the following method, for example. That is, in place of a compound that includes nitrogen, the graphene is made to react with diborane, triethyl boron, trimethyl boron, or the like, which include boron, in a methane, hydrogen, or argon flow in the CVD. Aside of this exception, the boron-substituted graphene can be manufactured by the same technique as that in the case of the nitrogen-substitution graphene.

The following silver nanowire can be used to form the silver nanowire layer 13 on the graphene film 11.

Usually, a metallic member having a diameter of about 10 to 500 nm and a length of about 0.1 to 50 μm is referred to as a metallic nanowire. The diameter of the metallic nanowire can be measured with a scanning electron microscope (SEM), for example. The length of the metallic nanowire can be determined by analyzing an SEM image, for example. In the present embodiment, silver nanowires having such diameters and lengths are used.

Parts of the plurality of silver nanowires 13a are in contact with or fused to each other to form a network-like structure such as a net-like or lattice-like structure. Thus, a plurality of conductive paths are formed, and a conductive cluster spanning the entire transparent conductor is formed (percolation theory). In order to form the conductive cluster, a certain degree of number density is required of the silver nanowire. Generally, a longer silver nanowire is more likely to form the conductive cluster. Further, a silver nanowire having a larger diameter has higher conductivity, in general. Thus, the network-like structure is formed by using the silver nanowire. Therefore, the conductive cluster exhibits a high conductivity as a whole, although the amount of metal is small. Moreover, the obtained silver nanowire layer 13 is flexible.

When the diameter of the silver nanowire 13a is too small, the electric resistance of the nanowire itself is increased. In contrast, when the diameter is too large, there is concern that the transparency of the transparent conductor may decrease due to an increase in light scattering or the like. When the diameter of the silver nanowire 13a is about 20 to 150 nm, such disadvantages are avoided. The diameter of the silver nanowire 13a is more preferably 35 to 120 nm.

When the silver nanowire 13a is too short, a sufficient conductive cluster is not formed, which results in an increase in electric resistance. In contrast, when the silver nanowire is too long, the dispersion of the metal nanowire in a solvent during the manufacture of an electrode or the like becomes unstable. When the silver nanowire has a length of about 1 to 40 μm, such disadvantages are avoided. The length of the silver nanowire is more preferably 5 to 30 μm.

The silver nanowire 13a can be manufactured by reducing an aqueous solution of silver ion using various reducing agents. The shape and size of the silver nanowire can be controlled by selecting the type of the reducing agent, protective polymer, and coexisting ions used during manufacture. A polyhydric alcohol such as ethylene glycol is preferably used as the reducing agent to manufacture the silver nanowire. Polyvinyl pyrrolidone is preferably used as the protective polymer to manufacture the silver nanowire. Wires of nano-order size, so-called nanowires, can be obtained by using such raw materials.

The silver nanowire layer 13 may include silver nanoparticles. Silver nanowires and silver nanoparticles easily aggregate with one another. Therefore, the silver nanoparticles act as an adhesive material that joins the silver nanowires well with each other. As a result, the silver nanoparticles function to lower the electric resistance of the conductive film. The silver nanowire layer 13 may include transparent conductive materials such as ITO nanoparticles, titanium oxide nanoparticles, zinc oxide nanoparticles, vanadium oxide nanoparticles, nickel oxide nanoparticles, chrome oxide nanoparticles, and transparent conductive polymers.

The transparent resin layer 14 on the silver nanowire layer 13 may be insoluble in the copper-etching solution, and may be obtained by laminating different transparent resin layers. For example, it is preferable that a transparent resin that contacts the graphene film 11 is a conductive transparent resin or graphene oxide, and an insulating transparent resin is stacked as an upper layer. The insulating transparent resin is formed of a thermoplastic resin, a thermosetting resin, or a light curing resin. Among the resins, the thermoplastic resin or the thermosetting resin is preferable, and the light curing resin is particularly preferable.

A manufacturing process for the thermoplastic resin is easy, and particularly suitable for an application requiring flexibility. For example, polyethylene, polypropylene, polystyrene, polymethyl methacrylate, polyethylene terephthalate, polyphenylene ether, polycarbonate, polyphenylene sulfide, a fluorine-based resin, a urethane resin, an acrylic elastomer, a styrene-based elastomer, an olefin-based elastomer, a vinyl chloride-based elastomer, a urethane-based elastomer, an amide-based elastomer, or the like are used as the thermoplastic resin.

The light curing resin can be cured in a short time, thereby allowing the processing time to be shortened. Curing in a short time is apt to cause distortion in the resin layer. However, the silver nanowire layer 13 and the graphene film in the present embodiment are flexible, and can endure the distortion. The light curing resin is preferably an ultraviolet curing resin. Examples thereof include an acrylate radical polymerizing resin and an epoxy cationic polymerizing resin. The acrylate resin is more preferable. The light curing resin may be subjected to a post annealing treatment after light irradiation.

Examples of the thermosetting resin include a phenol resin, a melamine resin, an epoxy resin, and a urea resin.

Particularly, in consideration of transparency, the transparent resin is preferably an amorphous fluorine resin, an acrylic thermoplastic elastomer, or the like.

The transparent resin layer 14 can be formed, for example, by applying the solution or melt of the transparent resin onto the silver nanowire layer 13 by spin coating, ink-jet coating, applicator coating, die coating, or the like.

Hereinafter, with reference to FIG. 6, a device for manufacturing a transparent conductor according to one embodiment will be described.

Figure 6:
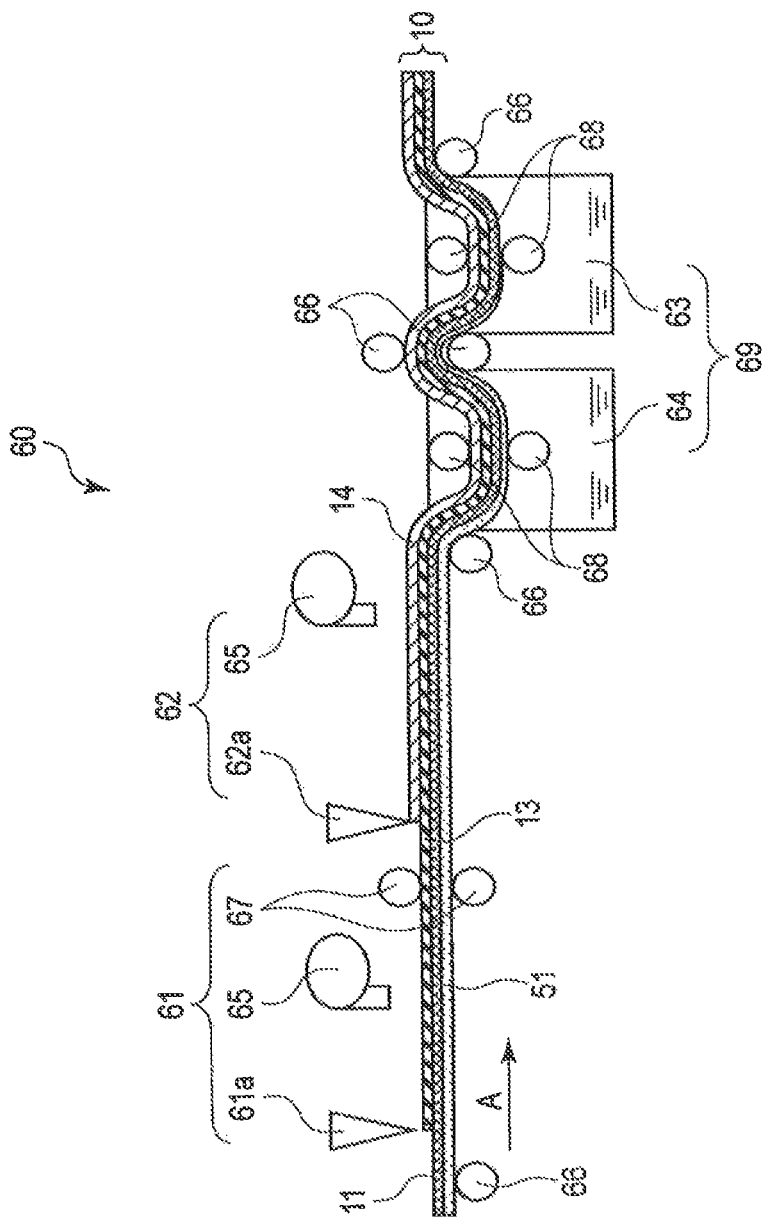
FIG. 6 is a schematic view of a device for manufacturing a transparent conductor according to one embodiment.

As shown in FIG. 6, in a manufacturing device 60, a graphene film 11 supported by a copper support 51 is made moveable in a direction of an arrow A by a transfer roller 66. The transfer roller 66 corresponds to a part of a conveying mechanism configured to continuously convey the graphene film 11 supported by the copper support 51. In the manufacturing device 60, a silver nanowire layer forming section 61, a transparent resin layer forming section 62, and a copper-etching section 69 are disposed in this order from an upstream side along a moving direction of the copper support 51. The silver nanowire layer forming section 61, the transparent resin layer forming section 62, and the copper-etching section 69 are collectively referred to as a treatment section.

The silver nanowire layer forming section 61 includes a silver nanowire feeding section 61a, a blower 65, and a pair of press rollers 67. The press rollers 67 may have a heating mechanism. The transparent resin layer forming section 62 includes a transparent resin feeding section 62a, and a blower 65. The copper-etching section 69 indispensably includes a first etching tank 63 containing a non-acidic copper-etching solution. The basic or weakly basic copper-etching solution as already described can be used as a non-acidic etching solution. The etching solution preferably includes $CuCl_2$ and ammonia.

As shown in FIG. 6, treatment time can be shortened by providing a second etching tank 64 containing an acidic copper-etching solution at an upstream position in relation to the first etching tank 63. Hydrochloric acid solutions of $FeCl_3$ or $CuCl_2$, or the like as already described can be used as the acidic copper-etching solution.

Silver nanowires fed onto the graphene film 11 from the silver nanowire feeding section 61a are dried by the blower 65, and then pressed by the pair of press rollers 67 to form a silver nanowire layer 13. A transparent resin is fed onto the silver nanowire layer 13 from the transparent resin layer feeding section 62a, and dried by the blower 65 to form a transparent resin layer 14.

The copper support 51 having the graphene film 11, the silver nanowire layer 13, and the transparent resin layer 14 is guided by a support roller 68 and immersed in the non-acidic copper-etching tank 63, to dissolve and remove the copper support. Thus, a transparent conductor 10 according to the present embodiment is obtained.

As described above, the manufacturing device 60 according to the embodiment comprises the conveying mechanism configured to continuously convey the graphene film 11 supported by the copper support 51, and the treatment section including the silver nanowire layer forming section 61, transparent resin layer forming section 62, and copper-etching section 69 disposed in order along the conveying direction of the graphene film. In the silver nanowire layer forming section 61, the silver nanowire layer 13 is manufactured on the graphene film. In the transparent resin layer forming part 62, the transparent resin layer 14, which does not dissolve in the copper-etching solution, is formed on the silver nanowire layer 13. The copper-etching section 69 includes the first etching tank 63 containing the non-acidic copper-etching solution. In the copper-etching section 69, the copper support is dissolved and removed by the copper-etching solution.

According to the manufacturing device according to the present embodiment, a high-quality transparent conductor can be easily manufactured. Moreover, by employing a roll-to-roll process, a transparent conductor having a large area can also be obtained.

The graphene film 11 can be referred to as a transparent conductor precursor. A device as described below can be used to manufacture the transparent conductor precursor.

A constitution of the device for manufacturing the transparent conductor precursor will be described with reference to FIG. 7.

Figure 7:
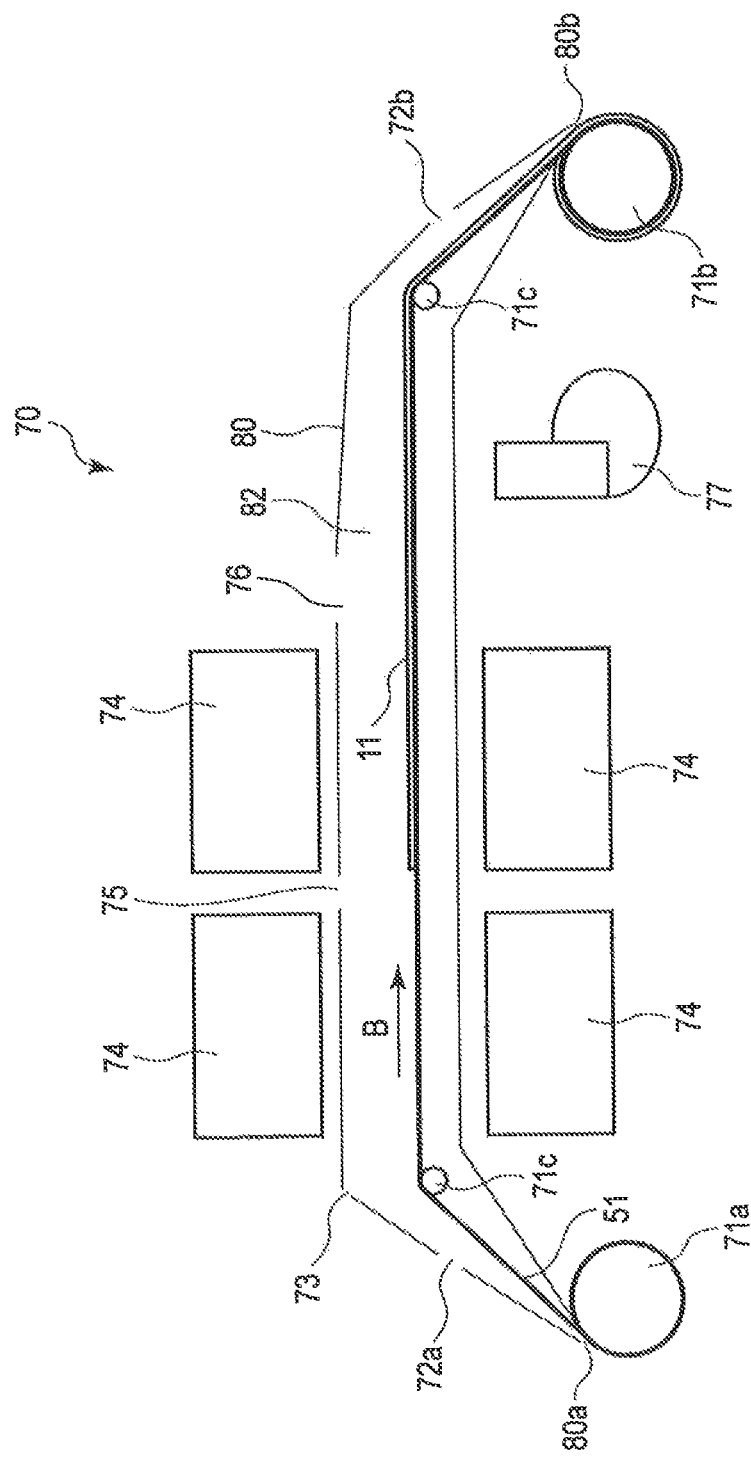
FIG. 7 is a schematic view of a device for manufacturing a transparent conductor according to another embodiment.

A manufacturing device 70 shown in FIG. 7 includes a defining member 80 configured to define a treatment area 82 in which a copper support 51 is continuously moved and treated. The defining member 80 includes an inlet 80a and an outlet 80b for the copper support. A conveying mechanism, configured to continuously convey the copper support 51 in a direction of an arrow B, includes a feed roller 71a, a transfer roller 71c, and a wind-up roller 71b. The feed roller 71a and the wind-up roller 71b are preferably motor-driven rollers that are compatible with a copper foil roll having a width of about 60 to 120 cm. A thickness of 10 to 20 μm is suitable for the copper support 51 in view of its strength.

On the defining member 80, a first inactive gas feed port 72a, a hydrogen gas feed port 73, a carbon-containing compound feed port 75, a gas discharge port 76, and a second inactive gas feed port 72b are provided in this order from an upstream side along a moving direction of the copper support 51. Heaters 74 are provided around the defining member 80 in a vicinity of the carbon-containing compound feed port 75. A cooler 77 is provided outside the defining member 80 between the gas discharge port 76 and the second inactive gas feed port 72b.

Examples of inactive gas fed in from the first and second inactive gas feed ports 72a and 72b include argon and nitrogen. Argon is preferable since it is less likely to leak. At the inlet 80a, through which the copper support 51 is introduced into the treatment area 82, the clearance for the copper support 51 has a narrow width of 1 mm or less. A portion of the inactive gas, which is fed into the treatment area 82 from the first inactive gas feed port 72a, flows out of the defining member from the introduction inlet 80a. This outflow of the portion of the inactive gas can prevent an inflow of external atmosphere into the treatment area 82.

From the hydrogen as feed port 73, hydrogen gas can be fed as is, without dilution. Alternatively, hydrogen gas that has been diluted with argon in advance may be fed. A carbon-containing compound such as methane is fed from the carbon-containing compound feed port 75. The carbon-containing compound can be fed as is, without dilution. Alternatively, a carbon-containing compound diluted with argon may be fed.

A standard electric heater can be used as the heater 74. Alternatively, a heater utilizing infrared heating may be used as the heater 74. An electrical current can be applied, to the copper support 51 to perform Joule heating.

Gas is discharged from the gas discharge port 76 using an exhaust pump. In this case, the flow rate of the inactive gas fed in from the first and second inactive gas feed ports 72a and 72b and the flow rate of gas discharged from the gas discharge port 76 are controlled, such that the pressure within the treatment area 82 in the defining member 80 does not become equal to or less than atmospheric pressure. A simple blower is preferably used as the cooler 77. However, water-cooling may also be used.

The inactive gas feed ports 72a and 72b, the hydrogen gas feed port 73, the carbon-containing compound feed port 75, and the gas discharge port 76 are preferably provided at a position lower than a height in which the copper support 51 is heated. This makes it easy to dispose a roll of the copper support (a copper-foil roll) at a position below the heating furnace. As a result, it becomes easy to purge a high-temperature reactant gas with an inactive gas, and to control reaction conditions of CVD to be uniform. The inlet 80a and the outlet 80b in the defining member 80 are also preferably provided at a position lower than the height in which the copper support 51 is heated. For example, the inlet 80a and the outlet 80b can be provided at a position lower by 30 cm or more than the height in which the copper support 51 is heated. The position of the outlet 80b in the defining member 80 is preferably the same as that of the inlet 80a, or lower.

Graphene in which a part of carbon atoms are substituted with nitrogen atoms or boron atoms can be manufactured by feeding a nitrogen-containing compound or a boron-containing compound as a substitution gas. The substitution gas can be fed into the treatment area 82 from the carbon-containing compound feed port 75. Alternatively, a substitution gas feed port configured to feed the substitution gas may be provided near the carbon-containing compound feed port 75. The nitrogen-containing compound or the boron-containing compound as the substitution gas is discharged from the gas discharge port 76 as a mixture with the inactive gas.

The manufacturing device 70 shown in FIG. 7 can continuously form the graphene film by a thermal CVD method at standard pressures. The manufacturing device 70 comprises the defining member 80 configured to define the treatment area 82, in which the copper support 51 is continuously conveyed and treated; the conveying mechanism configured to continuously convey the copper support 51; the first inactive gas feed port 72a, hydrogen gas feed port 73, carbon-containing compound feed port 75, gas discharge port 76, and second inactive gas feed port 72b provided on the defining member 80 in this order along the conveying direction of the copper support 51; the heaters 74 provided around the defining member 80 in a vicinity of the carbon-containing compound feed port 75; and the cooler 77 provided outside the defining member 80 between the gas discharge port 76 and the second inactive gas feed port 72b.

The copper support 51 is continuously conveyed in the treatment area 82 in the defining member 80. The inactive gas is fed from the first inactive gas feed port 72a, to purge the contents in the treatment area 82. The hydrogen gas is introduced into the inactive gas from the hydrogen gas feed port 73. The carbon-containing compound is introduced into the inactive gas from the carbon-containing compound feed port 75, and the copper support is heated by the heaters 74, thereby forming the graphene film 11. The inactive gas including the carbon-containing compound is removed from the gas discharge port 76, and the cooper support 51 is cooled by the cooler 77. The inactive gas is fed from the second inactive gas feed port 72b, to purge the contents in the treatment area 82.

Usually, when a graphene film is formed by a batch system using a thermal CVD method, cooling from high temperature requires time. In the device according to the present embodiment, inactive gas can be continuously fed into the treatment area to purge the contents, thereby cooling the graphene film. Accordingly, the device has high productivity.

By using the device having the above constitution, graphene films used as the precursor of transparent conductors can be efficiently manufactured. The present embodiment can also be executed in a mode, in which a copper foil is cut, placed on a tray if needed, and conveyed by a belt.

Hereinafter, specific examples according to the present embodiment will be shown.

Example 1

A transparent conductor 10 shown in FIG. 1D is manufactured. The transparent conductor 10 includes a graphene film 11 formed of single-layered graphene and/or multi-layered graphene having carbon atoms partially substituted with nitrogen atoms, a silver nanowire layer 13 stacked onto the graphene film 11, and a transparent resin layer 14 covering the silver nanowire layer 13.

The single-layered graphene having carbon atoms partially substituted with nitrogen atoms is formed by a thermal CVD method using a Cu foil having a thickness of 15 µm as a copper support. The surface of the Cu foil is annealed in advance by a heat treatment with laser radiation, to increase the crystal grain. Under standard pressure, a gas mixture including argon and hydrogen at a ratio of 65:200 (ccm) is fed into a treatment area containing the Cu foil. The Cu foil is treated at 800° C. for 10 minutes. A feed port through which the gas mixture is supplied is provided at a position lower than that of the copper foil to be heated.

Next, CVD is performed at 800° C. for 5 minutes by using a gas mixture including ammonia, methane, hydrogen, and argon at a ratio of 2:60:65:200 (ccm) as a reactant gas, to form nitrogen-doped graphene. Exhaust gas is discharged from a gas discharge port provided at a position lower than that of an inactive gas feed port. Most of graphene formed by the CVD method is single-layered graphene. However, two or more layers of multi-layered graphene may also form, depending on conditions. After treatment under a gas mixture flow including ammonia and argon for 5 minutes at 900° C., the graphene is cooled using a blower under an argon flow. Thus, a graphene film supported by the copper support is manufactured.

Silver nanowires (diameter: 40 to 50 nm, manufactured by Blue Nano) are dispersed in methanol at a concentration of 2 mg/ml to obtain a solvent dispersion. The solvent dispersion is applied onto the above graphene film, and then mechanically pressed at a pressure of 1.6 kN/cm$^2$, to form a silver nanowire layer.

CYTOP (809A) which is a fluorine-based resin manufactured by Asahi Glass Co., Ltd, is used as a transparent resin. The resin is applied onto the silver nanowire layer by using an applicator, and dried, to manufacture a transparent resin layer.

The entire laminate structure, including the silver nanowire layer and the transparent resin layer formed on the graphene film supported by the copper support, is immersed in an etching tank containing ammonia alkaline copper (II) chloride for 1.5 hours. The copper foil used as the copper support is dissolved, thereby exposing the graphene film, and thus a transparent conductor according to the present example is obtained.

The transparent conductor according to the present example has a surface resistance as measured by a four-probe method, of about 10Ω/□, and a diffuse transmittance at 550 nm, of 70 to 75%.

The amount of copper included in the graphene film can be estimated by X-ray photoelectron spectroscopy (XPS). In the present example, under the above conditions, the ratio of copper atoms to carbon atoms is 0.2 atomic % or less.

The doping amount (N/C atomic ratio) of nitrogen in graphene can be estimated by X-ray photoelectron spectroscopy (XPS). Under the above conditions, the ratio of nitrogen atoms to carbon atoms (N/C) is 1/100 to 1/20. The ratio of oxygen atoms to carbon atoms of graphene measured using XPS is 1/100 to 1/200.

In the X-ray photoelectron spectrum of the 1s electron of the nitrogen atoms, the ratio ($I_{398.5}/I_{401.2}$) of the intensity ($I_{398.5}$) at 398.5 eV to the intensity ($I_{401.2}$) at 401.2 eV is 1/10 to 1/25. The work function can be measured under vacuum by ultraviolet photoelectron spectroscopy (UPS), and is 4.0 or less.

As shown in FIG. 2, a ratio of a peak height of the G band to that of the D band (G/D) is 2 or more in the Raman spectrum of the graphene according to the present example.

The results of AFM measurements show that recesses having a depth of about 5 nm exist in portions of the graphene film that are directly in contact with the transparent resin layer. Recesses of a depth of this level do not substantially pose any problem. Therefore, the surface flatness of the transparent conductor according to the present example can be considered good.

Comparative Example 1

The etching tank containing ammonia alkaline copper (II) chloride is changed to an etching tank containing acidic copper (II) chloride, and the copper foil used as a copper support is dissolved and removed in the etching tank containing acidic copper (II) chloride. Aside of this exception, a transparent conductor according to the present comparative example is manufactured using the same technique as that of Example 1.

Due to using an acidic copper-etching solution, silver nanowires are dissolved, and therefore, the transparent conductor according to the present comparative example has high electrical resistance.

Example 2

In the removal of the copper foil used as a copper support by dissolving, a laminate structure, including a silver nanowire layer and a transparent resin layer formed on a graphene film supported by a copper support, is immersed in an etching tank of a hydrochloric acid solution of $FeCl_3$ for 15 minutes. Subsequently, the laminate structure is immersed in an etching tank of a mixed aqueous solution including a weak alkaline organic amine, an organic carboxylic acid, and copper (II) chloride for 20 minutes. Aside of this exception, a transparent conductor of Example 2 is obtained using the same technique as that of Example 1. In the present example, a transparent conductor having a surface resistance, transmittance, and flatness that are equivalent to those of Example 1 is obtained in a shorter etching time.

Example 3

A non-solvent type acrylic resin, which is a light curing resin, is used as a transparent resin. The light curing resin is applied onto the silver nanowire layer, and then irradiated with ultraviolet light to cure the light curing resin, thereby forming a transparent resin layer. Aside of this exception, a transparent conductor of Example 3 is obtained using the same technique as that of Example 1. The transparent conductor according to the present example has hardness that is higher than that of the transparent conductor of Example 1, but a surface resistance, transmittance, and flatness that are substantially the same as those of the transparent conductor of Example 1.

Example 4

A transparent conductor of Example 4 is obtained using the same technique as that of Example 1 except that an ethyl acetate solution of KURARITY manufactured by Kureha Corporation is used as a transparent resin, and pressing by a roller is abbreviated. The transparent conductor according to the present example has flexibility that is higher than that of the transparent conductor of Example 1. AFM measurements show that recesses of about 20 nm exist on the surface of the graphene film at portions that are directly in contact with the transparent resin layer.

Example 5

Before CYTOP is applied, a solvent dispersion including titanium oxide nanoparticles having an average diameter of 20 nm is applied onto the silver nanowire layer, and heated at 250° C. under nitrogen. After cooling, CYTOP is applied onto the silver nanowire layer having the titanium oxide nanoparticles. Aside of these exceptions, a transparent conductor is manufactured in the same manner as in Example 1.

AFM measurements show that recesses having a depth of about 3 nm exist on portions of the graphene film that are directly in contact with the transparent resin layer. Recesses of a depth of this level do not substantially pose any problem, therefore the surface flatness of the transparent conductor according to the present example can be considered good. Compared with the case where the transparent conductor includes no titanium oxide, the surface resistance is also lower.

Example 6

Unsubstituted graphene is obtained by using a gas mixture including methane, hydrogen, and argon at a ratio of 60:65:200 (ccm) as a reactant gas, in place of the gas mixture including ammonia, methane, hydrogen, and argon used in Example 1. Exhaust gas is discharged from a gas discharge port provided at a position lower than that of an inactive gas feed port. Most of graphene formed by a CVD method is single-layered graphene. However, two or more layers of multi-layered graphene may also be produced, depending on conditions. After treatment under an argon flow at 900° C. for 5 minutes, the graphene is cooled using a blower under an argon flow. Thus, a graphene film supported by a copper support is manufactured.

Before CYTOP is applied, a solvent dispersion including ITO nanoparticles having an average diameter of 20 nm is applied onto the silver nanowire layer, and heated at 250° C. under nitrogen. After cooling, CYTOP is applied onto the silver nanowire layer having the ITO nanoparticles. Aside of these exceptions, a transparent conductor is manufactured in the same manner as in Example 1.

AFM measurements show that recesses having a depth of about 3 nm exist on portions of the graphene film that are directly in contact with the transparent resin layer. Recesses of a depth of this level do not substantially pose any problem, therefore the surface flatness of the transparent conductor according to the present example can be considered good. Furthermore, compared with the case where the transparent conductor includes no ITO, the surface resistance is lower.

Example 7

Silver nanowires are applied onto a graphene film, and a silver nanowire layer is then formed without being mechanically pressed. Next, before CYTOP is applied, an ethanol dispersion including graphene oxide is applied onto the silver nanowire layer, and heated at 60° C. under nitrogen. After cooling, CYTOP is applied onto the silver nanowire layer having the graphene oxide. Aside of these exceptions, a transparent conductor is manufactured in the same manner as in Example 1. The surface resistance of the transparent conductor according to the present example is the same as that of the case where mechanical pressing is performed.

According to the embodiment described above, the silver nanowire layer including the plurality of silver nanowires and having the openings is formed on the graphene film supported by the copper support. Then, the transparent resin layer insoluble in the copper-etching solution is formed on the silver nanowire layer such that the transparent resin layer contacts the graphene film through the openings. The copper support is then brought into contact with the non-acidic copper-etching solution to remove the copper support, thereby exposing the graphene film. As such, the high-quality transparent conductor can be easily manufactured.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of manufacturing a transparent conductor, comprising:
    forming a silver nanowire layer on a graphene film supported by a copper support, the silver nanowire layer comprising a plurality of silver nanowires and having an opening;
    forming a transparent resin layer on the silver nanowire layer such that the transparent resin layer contacts the graphene film through the opening, the transparent resin layer being insoluble in a copper-etching solution; and
    removing the copper support by bringing the copper support into contact with a non-acidic copper-etching solution after forming the transparent resin layer, to expose the graphene film.

2. The method according to claim 1, wherein the transparent resin layer comprises a thermosetting resin or a light curing resin.

3. The method according to claim 1, wherein the non-acidic copper-etching solution is basic.

4. The method according to claim 3, wherein the non-acidic copper-etching solution comprises $Cu\, Cl_2$, ammonia, or an organic amine.

5. The method according to claim 3, further comprising bringing the copper support into contact with an acidic copper-etching solution before bringing the copper support into contact with the non-acidic copper-etching solution.

6. The method according to claim 5, wherein the acidic copper-etching solution comprises $Fe\, Cl_3$ or $Cu\, Cl_2$.

7. The method according claim 1, wherein the copper support is a copper foil having a thickness of 1 μm or more and 50 μm or less.

8. The method according to claim 1, wherein the graphene film is manufactured by a thermal CVD method.

9. The method according to claim 1, further comprising pressing the silver nanowire layer before forming the transparent resin layer.

* * * * *